(12) United States Patent
Yamaguchi et al.

(10) Patent No.: US 9,099,578 B2
(45) Date of Patent: Aug. 4, 2015

(54) STRUCTURE FOR CREATING OHMIC CONTACT IN SEMICONDUCTOR DEVICES AND METHODS FOR MANUFACTURE

(71) Applicant: NUSOLA, INC., Burlingame, CA (US)

(72) Inventors: Atsushi Yamaguchi, Nagaoka (JP); Jose Briceno, Tokyo-to (JP)

(73) Assignee: Nusola, Inc., Scottsdale, AZ (US)

( * ) Notice: Subject to any disclaimer, the term of this patent is extended or adjusted under 35 U.S.C. 154(b) by 0 days.

(21) Appl. No.: 13/844,521

(22) Filed: Mar. 15, 2013

(65) Prior Publication Data

US 2013/0320343 A1 Dec. 5, 2013

Related U.S. Application Data

(60) Provisional application No. 61/722,693, filed on Nov. 5, 2012, provisional application No. 61/655,449, filed on Jun. 4, 2012.

(51) Int. Cl.
| | |
|---|---|
| *H01L 29/04* | (2006.01) |
| *H01L 31/0224* | (2006.01) |
| *H01L 31/20* | (2006.01) |
| *H01L 31/0216* | (2014.01) |
| *H01L 31/18* | (2006.01) |

(52) U.S. Cl.
CPC ...... *H01L 31/0224* (2013.01); *H01L 31/02167* (2013.01); *H01L 31/022425* (2013.10); *H01L 31/1864* (2013.01); *H01L 31/20* (2013.01); *Y02E 10/50* (2013.01); *Y02E 10/52* (2013.01)

(58) Field of Classification Search
CPC ............ H01L 21/0485; H01L 29/1608; H01L 31/204; H01L 31/0745
USPC .............................................. 257/53; 438/48
See application file for complete search history.

(56) References Cited

U.S. PATENT DOCUMENTS

| | | | |
|---|---|---|---|
| 4,072,541 A | 2/1978 | Meulenberg et al. |
| 4,163,677 A | 8/1979 | Carlson et al. |
| 4,167,015 A | 9/1979 | Hanak |
| 4,404,422 A | 9/1983 | Green et al. |
| 4,417,092 A | 11/1983 | Moustakas et al. |

(Continued)

FOREIGN PATENT DOCUMENTS

| | | |
|---|---|---|
| CN | 1067155 C | 6/2001 |
| WO | 2008146442 A1 | 12/2008 |
| WO | 2012000015 A1 | 1/2012 |

OTHER PUBLICATIONS

Chemandy Electronics, "Calculator for Skin Effect depth," Aug. 13, 2010 http://chemandy.com/calculators/skin-effect-calculator.htm.

*Primary Examiner* — David Vu
*Assistant Examiner* — Brandon Fox
(74) *Attorney, Agent, or Firm* — Robert D. Becker; Manatt, Phelps & Phillips LLP

(57) ABSTRACT

A semiconductor-to-metal interface with ohmic contact is provided. The interface includes a semiconductor material, a metal layer, and a silicon carbide layer disposed between the semiconductor material and the metal layer. The silicon carbide layer causes the formation of a semiconductor-to-metal interface with ohmic contact. Applications include forming a photovoltaic device with ohmic contact by disposing a layer of silicon carbide over the photovoltaic material before depositing a bottom electrode layer of metal to complete the bottom of a photovoltaic cell.

14 Claims, 3 Drawing Sheets

(56) References Cited

U.S. PATENT DOCUMENTS

| | | |
|---|---|---|
| 5,065,698 A | 11/1991 | Koike |
| 5,103,285 A | 4/1992 | Furumura et al. |
| 5,286,306 A | 2/1994 | Menezes |
| 5,360,491 A | 11/1994 | Carey et al. |
| 5,427,977 A | 6/1995 | Yamada et al. |
| 5,738,731 A | 4/1998 | Shindo et al. |
| 5,877,077 A * | 3/1999 | Kronlund ............... 438/602 |
| 6,251,756 B1 | 6/2001 | Horzel et al. |
| 6,340,788 B1 | 1/2002 | King et al. |
| 6,566,685 B2 | 5/2003 | Morikawa |
| 6,770,143 B2 | 8/2004 | Zhang et al. |
| 7,238,968 B2 | 7/2007 | Nakata |
| 7,411,219 B2 * | 8/2008 | Woodin et al. ............ 257/77 |
| 7,462,372 B2 | 12/2008 | Konuma et al. |
| 8,110,737 B2 | 2/2012 | Luch |
| 8,193,031 B2 | 6/2012 | Hosoba et al. |
| 8,389,318 B2 | 3/2013 | Ostermann |
| 2003/0177976 A1 | 9/2003 | Oki et al. |
| 2005/0139966 A1 * | 6/2005 | Scarlete et al. ............ 257/632 |
| 2006/0231802 A1 | 10/2006 | Konno |
| 2007/0137692 A1 | 6/2007 | Carlson |
| 2009/0127519 A1 | 5/2009 | Abe et al. |
| 2009/0183677 A1 | 7/2009 | Tian et al. |
| 2009/0269913 A1 | 10/2009 | Terry et al. |
| 2009/0308440 A1 | 12/2009 | Adibi et al. |
| 2010/0047952 A1 | 2/2010 | Ohnuma et al. |
| 2010/0052088 A1 | 3/2010 | Carey et al. |
| 2010/0059117 A1 | 3/2010 | Shi et al. |
| 2010/0258167 A1 | 10/2010 | Chang et al. |
| 2010/0261302 A1 | 10/2010 | Rana et al. |
| 2010/0297802 A1 | 11/2010 | Becker et al. |
| 2011/0081745 A1 | 4/2011 | Wu et al. |
| 2011/0088760 A1 | 4/2011 | Sheng et al. |
| 2011/0089420 A1 | 4/2011 | Prabhakar |
| 2011/0197960 A1 | 8/2011 | Pham et al. |
| 2011/0198256 A1 | 8/2011 | Rebstock |
| 2011/0240109 A1 | 10/2011 | Janz et al. |
| 2011/0306163 A1 | 12/2011 | Song et al. |
| 2012/0049242 A1 | 3/2012 | Atanackovic et al. |
| 2012/0122264 A1 | 5/2012 | Machii et al. |
| 2012/0210936 A1 | 8/2012 | Wong et al. |
| 2012/0285517 A1 | 11/2012 | Souza et al. |
| 2012/0318347 A1 | 12/2012 | Junghanel et al. |
| 2013/0020491 A1 * | 1/2013 | Mazzillo .................. 250/372 |
| 2013/0255774 A1 | 10/2013 | Briceno et al. |

* cited by examiner

STRUCTURE FOR CREATING OHMIC CONTACT IN SEMICONDUCTOR DEVICES AND METHODS FOR MANUFACTURE

CROSS-REFERENCE TO RELATED APPLICATIONS

This application claims the benefit of U.S. Provisional Application No. 61/722,693, entitled "Photovoltaic Cell and Methods of Manufacture," filed on Nov. 5, 2012, U.S. Provisional Application No. 61/655,449, entitled "Structure For Creating Ohmic Contact In Semiconductor Devices And Methods for Manufacture," filed on Jun. 4, 2012, the entireties of which are incorporated by reference as if fully set forth herein.

This application is related to copending U.S. application Ser. No. 13/844,428, "Photovoltaic Cell and Methods of Manufacture," filed on even date herewith, the entirety of which is incorporated by reference as if fully set forth herein.

FIELD OF THE INVENTION

The present invention relates to creating ohmic contact in a metal-to-semiconductor interface, and in particular, structure and method of manufacture for achieving such ohmic contact.

BACKGROUND OF THE INVENTION

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Certain semiconductor devices, such as photovoltaic cells, are composed of a metal component, such as one or more electrodes, which is in contact with a semiconductor component. Typically a metal-to-semiconductor interface will form a high resistance contact interface such as Schottky barrier, which is an undesirable interface for applications such as a photovoltaic cell or other semiconductor devices.

One approach for reducing contact resistivity is to increase impurities at the contact interface by performing doping processes, such as ion implantation, heat treatment, or other diffusion methods, or by performing chemical etching. These processes are costly and normally require the use of toxic materials and expensive equipment.

BRIEF SUMMARY OF PREFERRED EMBODIMENTS OF THE INVENTION

It is an object of the preferred embodiments of the invention to provide a novel structure for creating an ohmic contact at a metal-to-semiconductor interface, and to provide techniques for manufacturing the structure that does not require uses of toxic additives and doping processes.

BRIEF DESCRIPTION OF THE DRAWINGS

Preferred embodiments of the present invention is illustrated by way of example, and not by way of limitation, in the figures of the accompanying drawings and in which like reference numerals refer to similar elements and in which.

DETAILED DESCRIPTION OF PREFERRED EMBODIMENTS OF THE INVENTION

In the following description numerous specific details such as specific parameters for performing physical vapor deposition methods have been set forth to provide a more thorough understanding of embodiments of the present invention. It will be appreciated however, by one skilled in the art, that embodiments of the invention may be practiced without such specific details or with different implementations for such details. Additionally some well known structures have not been shown in detail to avoid unnecessarily obscuring the present invention.

Figure 1:
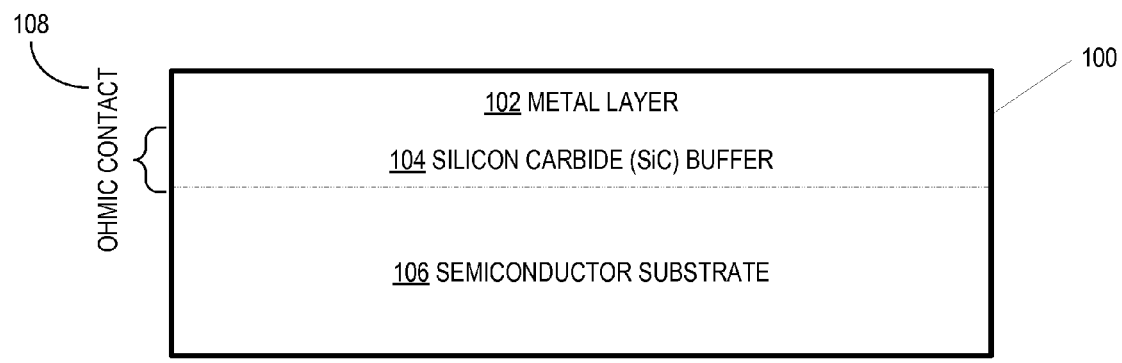
FIG. 1 is a block diagram that illustrates a structure for creating an ohmic contact at a metal-to-semiconductor interface, according to embodiments of the invention.

In accordance with preferred embodiments of the invention, FIG. 1 is a block diagram that illustrates a structure for creating an ohmic contact at a metal-to-semiconductor interface, according to one embodiment of the invention.

Structure 100 comprises semiconductor substrate 106, metal layer 102, and silicon carbide (SiC) buffer 104 between semiconductor substrate 106 and metal layer 102. Ohmic contact 108 is formed in structure 100 at the metal-to-semiconductor interface of semiconductor substrate 106 and metal layer 102 due to the presence of silicon carbide buffer 104.

In some embodiments, metal layer 102 is any metal whose work function is equal to or below that of aluminum (Al), including but not limited to aluminum (Al), gold (Au), copper (Cu), silver (Ag), indium (In), cadmium (Cd), thallium (Tl), tin (Sn), tungsten (W), platinum (Pt), gallium (Ga), zinc (Zn), titanium (Ti), and nickel (Ni), and metallic alloys.

Figure 2:
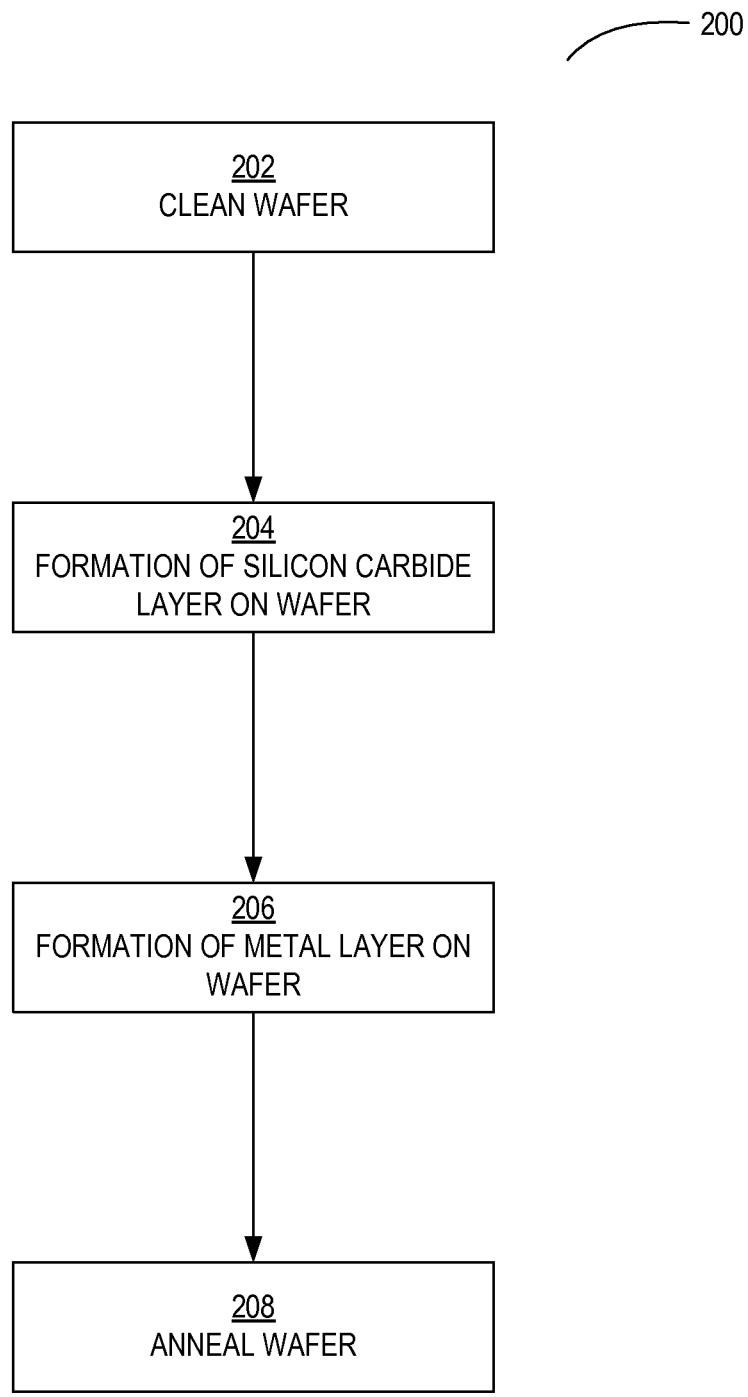
FIG. 2 is a flow diagram that illustrates an example process for manufacturing a structure for creating an ohmic contact at a metal-to-semiconductor interface, according to embodiments of the invention.

In accordance with preferred embodiments of the invention, FIG. 2 is a flow diagram that illustrates process 200 for manufacturing structure 100. At step 202, semiconductor substrate 106 is cleaned. In some embodiments, semiconductor substrate 106 is a silicon wafer with photovoltaic layer included. Other examples of semiconductor substrate 106 include, but are not limited to silicon in other forms, such as germanium and other semiconductor of elements in group IV. Semiconductor substrate 106 is not limited to an element semiconductor as silicon, but include compound semiconductors as III-V compounds or II-VI compound semiconductor materials.

Semiconductor substrate 106 is cleaned to remove any natural oxide film formed on the surface. An example of a process of cleaning semiconductor substrate 106 includes, but is not limited to, dipping semiconductor substrate 106 in a solution of hydrofluoric acid, rinsing semiconductor substrate 106 in water, and air-drying semiconductor substrate 106. It is appreciated by one of skill in the art that step 202 includes other approaches for removing undesired substances at the surface of semiconductor substrate 106.

At step 204, in some embodiments, an amorphous silicon carbide (a-SiC) layer is deposited on semiconductor substrate 106 by physical vapor deposition (PVD), such as sputtering, to form silicon carbide buffer 104. In some embodiments, a target for performing PVD is beta silicon carbide (β-SiC). An example of a sputtering method used at step 204 includes RF sputtering. In a preferred embodiment of the invention, power of approximately RF 2.2 Watt/cm$^2$, in Ar atmosphere, is used in RF sputtering at step 204, in which the semiconductor substrate 106 is heated to a temperature of 500 K or above. Other examples of sputtering methods used at step 204 include any sputtering method capable of depositing silicon carbide on semiconductor substrate 106.

At step 206, in some embodiments, metal layer 102 is deposited onto silicon carbide buffer 104 formed at step 204 by physical vapor deposition methods, such as sputtering, screen painting, or ink jet printing.

In some embodiments, steps 204 and 206 are dry sputtering processes, performed without using toxic materials, and without the need for pre- and/or post-process steps as would be necessary in normal wet process steps. Accordingly, process 200 provides the benefit of being low-cost and environmentally friendly.

Fabrication conditions for steps 204 and 206, according to some embodiments of the invention, are presented in Table 1.

TABLE 1

Ohmic contact fabrication conditions

| Parameter | Value Range | Preferred embodiment |
|---|---|---|
| SiC target | β-SiC target | β-SiC target |
| a-SiC layer thickness (nm) | 5 to 500 | 200 |
| SiC sputtering atmosphere and pressure (Pa) | Ar<br>0.1 to $10^3$ | Ar<br>1 |
| Sputter RF power for a-SiC (W) | 1~4 | 2.2 |
| Optional semiconductor substrate heating during sputtering | over 500K | 600K |
| Metal for contact | Al, Au, Cu, Ag, In, Tl, Sn, W, Ga | Al |
| Metal layer thickness (nm) | 50 to 1000 | 500 |
| Metal sputtering atmosphere and pressure (Pa) | Ar<br>0.1 to $10^3$ | Ar<br>1 |
| RF power for metal deposition (W/cm$^2$) | 1~4 | 2.2 |

At step 208, an annealing process may optionally take place. In other embodiments, depending upon the choice of the metal, annealing process 208 is applied between steps 204 and 206.

Figure 3:
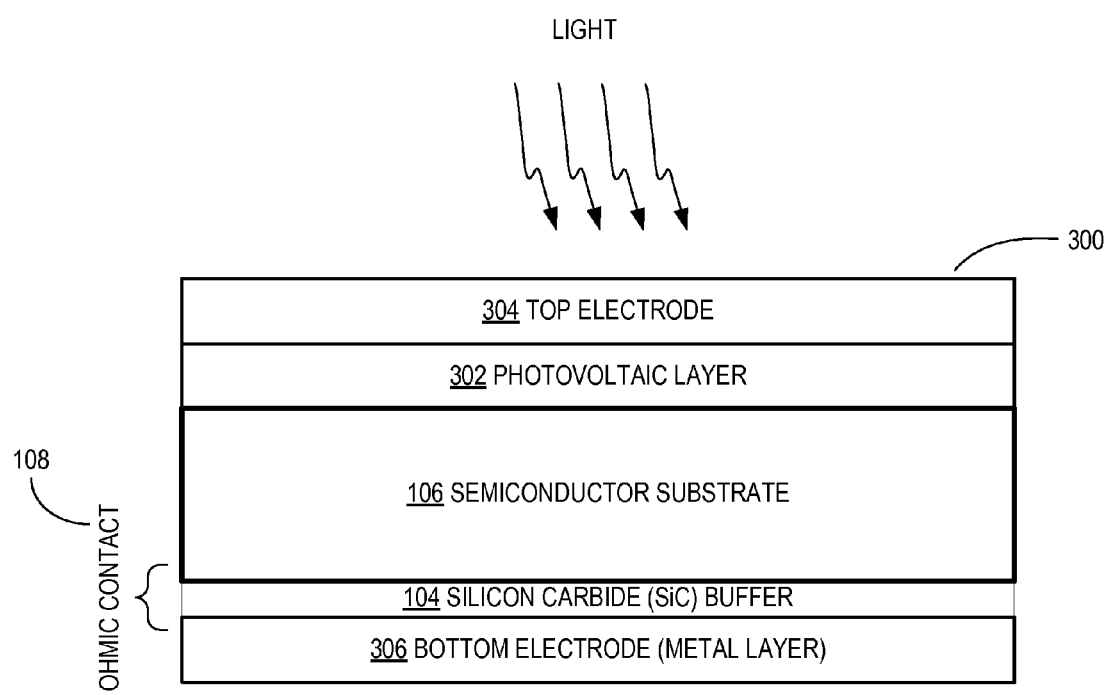
FIG. 3 is a block diagram that illustrates the structure configured as a component of a photovoltaic cell, according to embodiments of the invention.

In accordance with preferred embodiments of the invention, FIG. 3 is a block diagram that illustrates the structure configured as a component of photovoltaic cell 300. Photovoltaic cell 300 comprises photovoltaic layer 302, and semiconductor substrate 106. Photovoltaic layer 302 and semiconductor substrate 106 are disposed between top electrode 304 and bottom electrode 306. Bottom electrode 306 is an example of metal layer 102. Silicon carbide buffer 104 is disposed in between semiconductor substrate 106 and bottom electrode 306. In some embodiments, silicon carbide buffer 104 is deposited onto semiconductor substrate 106 in accordance with the method described with reference to FIG. 2. The metal-to-semiconductor interface between bottom electrode 306 and semiconductor substrate 106 results in ohmic contact 108 due to the presence of silicon carbide buffer 104 in between semiconductor substrate 106 and bottom electrode 306.

Other features, aspects and objects of the invention can be obtained from a review of the figures and the claims. It is to be understood that other embodiments of the invention can be developed and fall within the spirit and scope of the invention and claims.

The foregoing description of preferred embodiments of the present invention has been provided for the purposes of illustration and description. It is not intended to be exhaustive or to limit the invention to the precise forms disclosed. Various additions, deletions and modifications are contemplated as being within its scope. The scope of the invention is, therefore, indicated by the appended claims rather than the foregoing description. Further, all changes which may fall within the meaning and range of equivalency of the claims and elements and features thereof are to be embraced within their scope.

What is claimed is:

1. A semiconductor device with ohmic contact, comprising:
   a semiconductor material;
   metal layer; and
   a silicon carbide layer disposed between the semiconductor material and the metal layer, which causes the metal-to-semiconductor interface located between the metal layer and the semiconductor material to be an ohmic contact.

2. The semiconductor device with ohmic contact of claim 1, wherein the semiconductor material is a photovoltaic material.

3. The semiconductor device with ohmic contact of claim 1, wherein the metal layer is a bottom electrode, and the semiconductor material is a photovoltaic material.

4. The semiconductor device with ohmic contact of claim 1, herein the silicon carbide layer is amorphous silicon carbide.

5. The semiconductor device with ohmic contact of claim 1, wherein the metal layer comprises Al.

6. The semiconductor device with ohmic contact of claim 1, wherein the metal layer comprises any one of Au, Cu, Ag, In, Tl, Sn, W and Ga.

7. The semiconductor device with ohmic contact of claim 1, wherein the silicon carbide layer is deposited onto the semiconductor material by a sputtering process.

8. A method of manufacturing a semiconductor device with ohmic contact, comprising the steps of:
   providing a semiconductor material;
   forming a silicon carbide layer over the semiconductor material;
   forming a metal layer over the silicon carbide layer,
   wherein the silicon carbide layer causes the metal-to-semiconductor interface located between the metal layer and the semiconductor material to be an ohmic contact.

9. The method of claim 8, wherein the semiconductor material is a photovoltaic material.

10. The method of claim 8, wherein the metal layer is a bottom electrode, and the semiconductor material is a photovoltaic material.

11. The method of claim 8, wherein the silicon carbide layer is amorphous silicon carbide.

12. The method of claim 8, wherein the metal layer comprises Al.

13. The method of claim 8, wherein the metal layer comprises any one of Au, Cu, Ag, In, Tl, Sn, W and Ga.

14. The method of claim 8, wherein the silicon carbide layer is deposited onto the semiconductor material by a sputtering process.

* * * * *